United States Patent [19]
Wu

[11] Patent Number: 5,930,617
[45] Date of Patent: Jul. 27, 1999

[54] METHOD OF FORMING DEEP SUB-MICRON CMOS TRANSISTORS WITH SELF-ALIGNED SILICIDED CONTACT AND EXTENDED S/D JUNCTION

[75] Inventor: Shye-Lin Wu, Hsinchu, Taiwan

[73] Assignee: Texas Instruments-Acer Incorporated, Hsinchu, Taiwan

[21] Appl. No.: 09/048,154

[22] Filed: Mar. 25, 1998

[51] Int. Cl.[6] .................... H01L 21/8238; H01L 21/336
[52] U.S. Cl. .................. 438/233; 438/231; 438/305; 438/558; 438/564
[58] Field of Search .................................. 438/233, 229, 438/230, 231, 232, 199, 305, 306, 307, 301, 299, 558, 564, 596, 592, 585

[56] References Cited

U.S. PATENT DOCUMENTS

| | | | |
|---|---|---|---|
| 5,391,508 | 2/1995 | Matsuoka et al. | 438/305 |
| 5,504,024 | 4/1996 | Hsu | 438/305 |
| 5,620,914 | 4/1997 | Hikida et al. | 438/596 |
| 5,648,287 | 7/1997 | Tsai et al. | 438/305 |
| 5,656,519 | 8/1997 | Mogami | 438/233 |
| 5,691,212 | 11/1997 | Tsai et al. | 438/297 |
| 5,710,054 | 1/1998 | Gardner et al. | 438/564 |
| 5,759,885 | 6/1998 | Son | 438/199 |

*Primary Examiner*—Michael Trinh
*Attorney, Agent, or Firm*—Harness, Dickey & Pierce, P.L.C.

[57] ABSTRACT

The present invention includes forming an oxide layer on a substrate. An undoped polysilicon layers is deposited by chemical vapor deposition on the gate oxide layer. Next, a silicon nitride layer is successively formed on the polysilicon layer to act as an anti-reflective coating (ARC). Then, the undoped polysilicon layer, ARC layer, and the oxide layer are patterned to form ultra short channel polysilicon gates. A thermal annealing is performed to recover the etching damage in the substrate and generate a pad oxide layer on the surface of the polysilicon gate and the substrate. An nitrogen-doped amorphous silicon layer is formed on the gate structure and on the pad oxide. Next, an ion implantation is carried out to dope dopants into the gate and substrate, thereby forming source and drain. A steam oxidation is performed to convert the nitrogen-doped amorphous silicon layer to a nitrogen-doped thermal silicon dioxide layer. Simultaneously, an ultra-shallow extended source and drain junction adjacent to the gate structure is obtained by using the amorphous silicon layer as a diffusion source. Subsequently, the nitrogen-doped silicon dioxide layer is etched back to form oxide spacers. Then, the cap silicon nitride layer are removed. Then, two-step silicidation process are used to form silicided contacts.

18 Claims, 3 Drawing Sheets

METHOD OF FORMING DEEP SUB-MICRON CMOS TRANSISTORS WITH SELF-ALIGNED SILICIDED CONTACT AND EXTENDED S/D JUNCTION

FIELD OF THE INVENTION

The present invention relates to semiconductor devices, and more specifically, to complementary metal-oxide-semiconductor (CMOS) devices.

BACKGROUND

For ultra large scale integrated (ULSI) circuits application, the dimensions of devices are scaled down to sub-micron or deep sub-micron range. Self-aligned silicided (SALICIDE) process is the popular method to reduce the resistance of the gate, source and drain. Thus, CMOS devices with the self-aligned silicided process can increase the operation speed.

Recently, A Hori et al. proposed devices with ultra-shallow source and drain junction by using 5 KeV ion implantation and rapid thermal annealing. This method can be used to suppress the short channel effect. In this article, the source and drain extensions are fabricated by ion implantation to obtain ultra-shallow profile. Please refer to the article proposed by A. Hori, et al., in IEDM Tech. Dig., p.485, 1994, entitled "A 0.05 μm-CMOS with Ultra Shallow Source/Drain Junction Fabricated by 5 KeV Ion Implantation and Rapid Thermal Annealing".

For ULSI circuits application, the thickness of the gate oxide is necessary to be scaled down to nanometer dimension. Therefore, the reliability of the ultra thin oxide is a serious problem to the scaled devices. Typically, the reliability of the gate oxide is influenced by many factors, such as the hot carrier that is one of the major issues to degrade the performance of the devices even the supply voltage is reduced down to 2.5 V for 0.25 micron MOS. In order to provide reliable MOSFETs, many structures of the MOSFET have been proposed. For example, one of the prior arts approach to improve the hot carrier resistance is the use of a NICE (nitrogen implantation into CMOS gate electrode and source and drain) structure. The NICE structure is proposed by T. Kuroi, et al., in IEDM Tech. Dig., p325, 1993. In the structure, the surface channel PMOS with the p+ poly gate has been investigated in place of the buried channel with n+ poly gate. However, the high dose (higher than 4E15 atom/cm$^2$) nitrogen implantation will cause a drastic increase in the sheet resistance of poly-Si gate, therefore the performance of the devices will be degraded by this matter. One relating article is "Impact of Nitrogen Implantation on Highly Reliable Sub-Quarter-Micron Metal Oxide Field-Effect Transistors with Lightly Doped Drain Structure", S. Shimizu, et al., Jpn. J. Appel. Phys., vol. 35, p.802, 1996. The hot carrier degration in LDD n-MOS is caused by the generation of interface states or electron traps in the sidewall spacers. For the NICE structure, the nitrided gate oxide under the gate electrode is not effective in suppressing the generation of interface state electron traps. Thus, S. Shimizu proposed a NISW (nitrogen implantation in the silicon oxide sidewall spacers) structure to solve the aforesaid issue. The issue can be suppressed due to the dangling bonds and weakened bonds formed at the interface between the sidewall spacers and the silicon substrate are occupied by the segregated nitrogen atoms.

SUMMARY

In accordance with the present invention, a sub-micron CMOS device with extended shallow source and drain junction is provided. In one embodiment, a N-well and a P-well are created in a substrate using suitable processes. Subsequently, a thin oxide layer is formed on the substrate to act as the gate oxide. An undoped polysilicon layers is deposited by chemical vapor deposition on the gate oxide layer. Next, a silicon nitride layer is successively formed on the polysilicon layer to act as the anti-reflective coating (ARC). Then, the undoped polysilicon layer, ARC layer, and the oxide layer are patterned to form ultra short channel polysilicon gates on the P-well and N-well, respectively. A thermal annealing is performed to recover the etching damage in the substrate and generate a pad oxide layer on the surface of the polysilicon gate and the substrate. An nitrogen-doped amorphous silicon layer is formed on the gate structure and on the pad oxide by using the nitrogen in-situ doping process or the nitrogen ion implantation process. Next, an ion implantation is carried out to dope dopants into the gate and substrate, thereby forming source and drain that are separated from gate with a space about the thickness of the amorphous silicon layer. A steam oxidation is performed in an ambient containing oxygen atoms to convert the nitrogen-doped amorphous silicon layer into a nitrogen-doped thermal silicon oxide layer. Simultaneously, an ultra-shallow extended source and drain junction adjacent to the gate structure is obtained by using the amorphous silicon layer as a diffusion source. Subsequently, the nitrogen-doped silicon oxide layer is etched back to form nitrogen-doped oxide spacers on the side walls of the gate structure. Then, the cap silicon nitride layer are removed to expose the gate. Then, self-align silicide (SALICIDE) and polycide are respectively formed on the exposed substrate and gate by well known two-step silicidation process.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

The present invention proposes a novel method to fabricate the self-aligned silicided deep sub-micron meter CMOS transistors with an ultra-shallow extension source and drain junctions. The detailed description can be seen as follows and in conjunction with the accompanying drawings.

Figure 1:
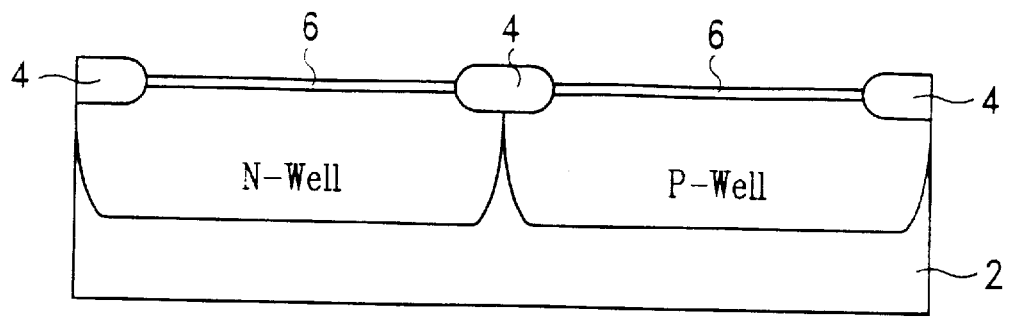
FIG. 1 is a cross sectional view of a semiconductor substrate illustrating the step of forming a pad oxide later on the semiconductor substrate according to the present invention.

Referring to FIG. 1, a single crystal substrate 2 with a <100> crystallographic orientation is used for the preferred embodiment. In this embodiment, Thick field oxide (FOX) regions 4 are created for the purposes of isolation. Typically, the FOX regions 4 are created via a first photoresist and dry etching to define a silicon nitride-silicon dioxide composite layer. After the photoresist is removed and wet clean process, thermal oxidation in an oxygen ambient is performed to form the FOX regions 4, to a thickness of about 3000–8000 angstroms. The silicon nitride layer is then typically removed using hot phosphoric acid solution while the silicon dioxide is removed by using diluted HF or BOE solution. Then, twin-well regions are formed in the substrate 2.

Subsequently, a thin oxide layer 6 is formed on the substrate 2 to act as a gate oxide. In the preferred embodiment, the gate oxide layer 6 is composed of silicon oxide that is formed by using an oxygen-steam ambient, at a temperature between about 800 to 1100 degrees centigrade. Alternatively, the gate oxide 6 may be formed using other known oxide chemical compositions and procedures. For example, the gate oxide layer 6 can be silicon dioxide formed using a chemical vapor deposition process, with a tetraethylorthosilicate (TEOS) source, at a temperature between about 600 to 800 degrees centigrade and a pressure of about 0.1 to 10 torr. In the preferred embodiment, the thickness of the gate oxide layer 6 is about 15–200 angstroms.

Figure 2:
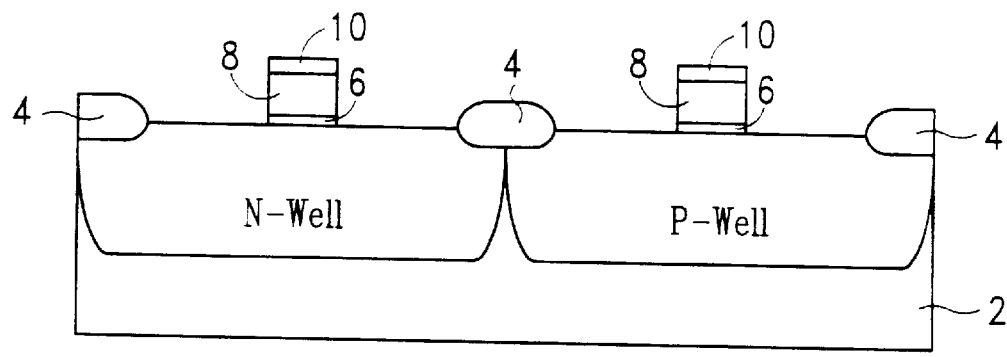
FIG. 2 is a cross sectional view of a semiconductor substrate illustrating the step of forming gate structures on the semiconductor substrate according to the present invention.

Referring to FIG. 2, after the silicon oxide layer 6 is formed. An undoped polysilicon layers 8 is deposited by chemical vapor deposition on the gate oxide layer 6. Next, a silicon nitride layer 10 is successively formed on the polysilicon layer 8 to act as an anti-reflective coating (ARC). Then, the undoped polysilicon layer 8, ARC layer 10, and the oxide layer 6 are patterned to form ultra short channel polysilicon gate structures on the P-well and N-well, respectively.

Figure 3:
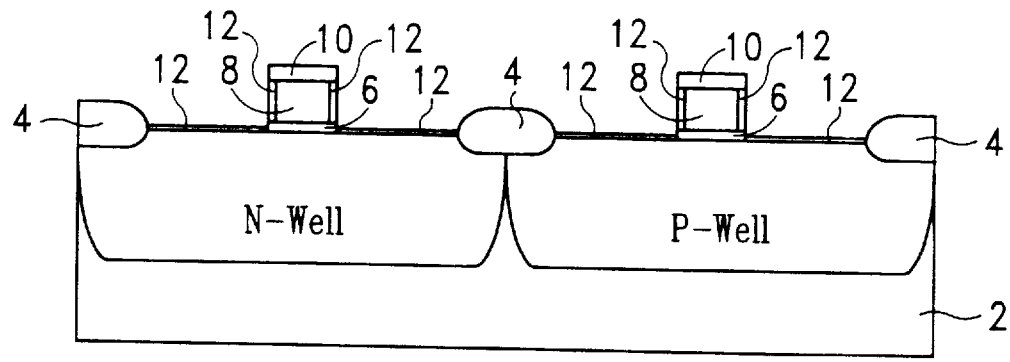
FIG. 3 is a cross sectional view of a semiconductor substrate illustrating the step of performing a thermal annealing according to the present invention.

Turning to FIG. 3, a thermal annealing is performed at about 750 to 1100 degrees centigrade to recover the etching damage in the substrate 2, thereby generating an ultra-thin pad oxide layer 12 on the surface of the polysilicon gate 8 and on the surface of the substrate 2 that is not covered by the gate 8.

Figure 4:
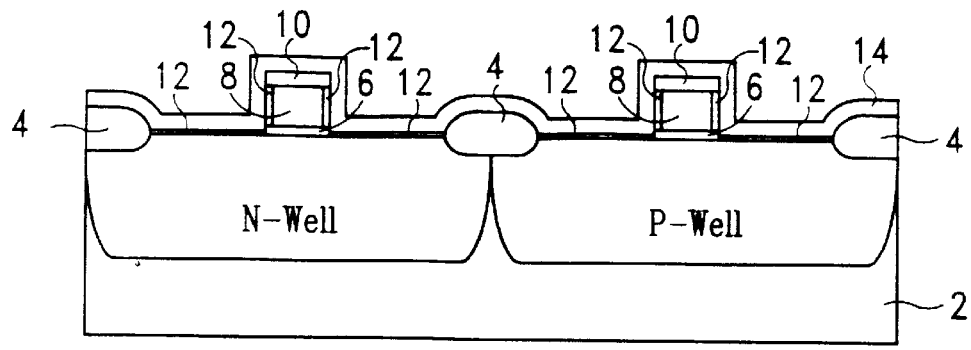
FIG. 4 is a cross sectional view of a semiconductor substrate illustrating the step of forming a nitrogen-doped amorphous silicon layer on the semiconductor substrate according to the present invention.
Figure 5:
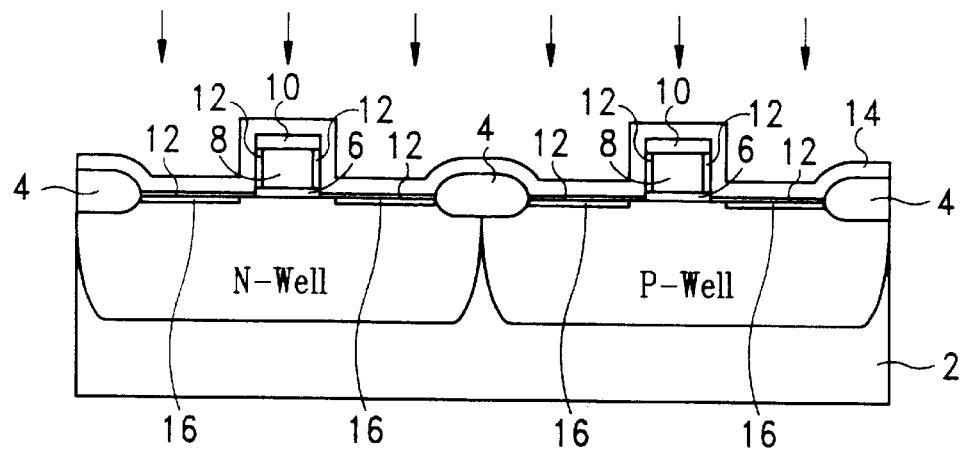
FIG. 5 is a cross sectional view of a semiconductor substrate illustrating the step of performing an ion implantation in the semiconductor substrate according to the present invention.

Now referring to FIG. 4, an nitrogen-doped amorphous silicon layer 14 is formed on the gate structures and on the pad oxide 12. Preferably, this can be done by using a nitrogen in-situ doped poly buffer method proposed by T. Kobayashi, et al., in IEDM Tech. Dig., p.683, 1994. In the step, the nitrogen in-situ doped amorphous silicon layer 14 is formed at 500 degrees centigrade with a $Si_2H_6$—$NH_3$ gas system. The concentration of the nitrogen is about 1E18–1E21 $cm^3$, and the thickness of the nitrogen in-situ doped amorphous silicon layer 14 is about 400 to 1500 angstroms. Alternatively, the nitrogen-doped amorphous silicon layer 14 can be formed by depositing an amorphous silicon, first. Then, an ion implantation containing nitrogen atoms is subsequently carried out to dope ions into the amorphous layer, thereby forming the nitrogen-doped amorphous silicon layer 14. Another way, such as the methods that are mentioned in the background respectively proposed by A. Hori and T. Kuroi may be used herein. The nitrogen-doped amorphous silicon layer 14 exhibits two advantages. First, the silicon layer remains a micro-crystal during oxidation, and further, oxidation rate of the nitrogen-doped amorphous silicon layer 14 is slower than non-doped silicon.

Next, an ion implantation is carried out to dope dopants into the gate 8 and in the substrate 2, thereby forming source and drain regions 16 that are separated from the gate structures containing gates 8 with a space about the thickness of the amorphous silicon layer 14, as shown in FIGURES. The dopant preferably includes arsenic, phosphorus or the combination thereof for the nMOS devices, and boron or $BF_2$ or the combination thereof for the PMOS devices, respectively. The energy and dosage of the implantation are about 0.5 to 120 KeV, 5E14 to 5E16 atoms/$cm^2$, respectively.

Figure 6:
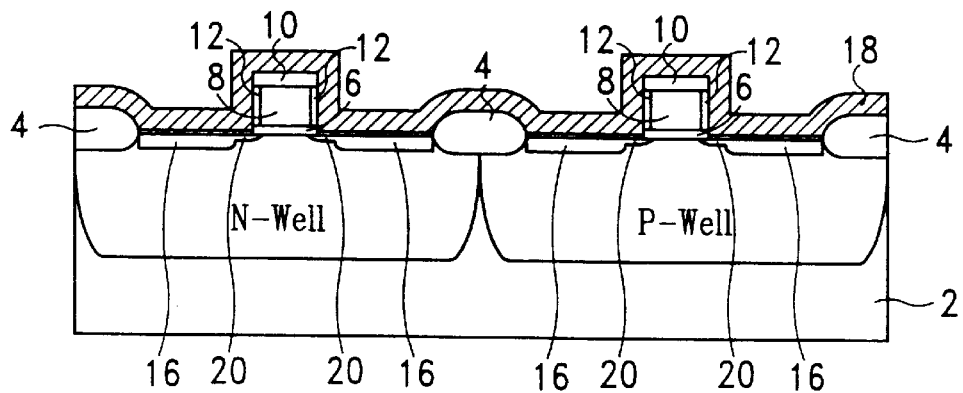
FIG. 6 is a cross sectional view of a semiconductor substrate illustrating the step of performing an oxidation according to the present invention.
Figure 7:
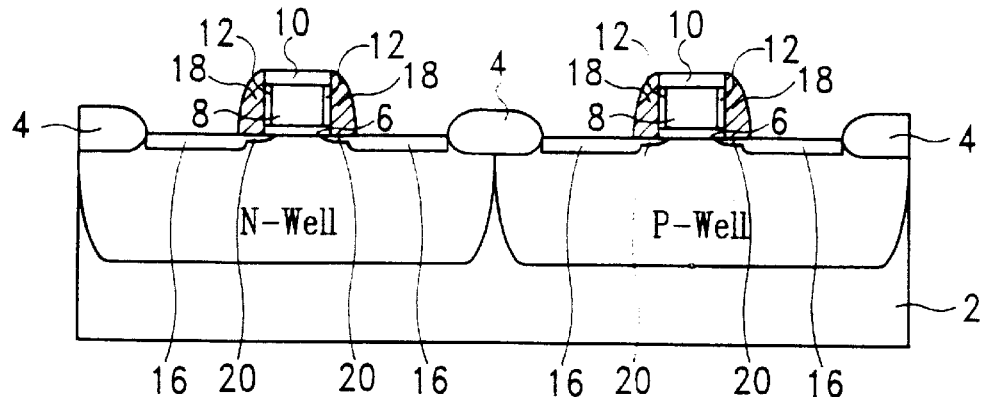
FIG. 7 is a cross sectional view of a semiconductor substrate illustrating the steps of performing an etching step to form spacers according to the present invention.

Turning to FIG. 6, a steam oxidation is performed in ambient containing oxygen to convert the nitrogen-doped amorphous silicon layer 14 to a nitrogen-doped thermal silicon oxide layer 18. In a case, the temperature for this step can range from 800 to 1150 degrees centigrade. Simultaneously, an ultra-shallow extended source and drain junctions 20 adjacent to the gate structures is obtained by using the amorphous silicon layer 14 as a diffusion source. An article relates to the matter proposed by S. L. Wu, et al., in IEEE Trans. Electron Devices, Vol. ED-40, P. 1797, 1993. In this paper, high performance shallow junction diode is formed by using an SAS (stacked amorphous silicon) as the dopant diffusion source. Subsequently, the nitrogen-doped silicon oxide layer 18 is anistropically etched back to form nitrogen-doped oxide spacers 18 on the side walls of the gate structure. The result structure is illustrated in FIG. 7.

Figure 8:
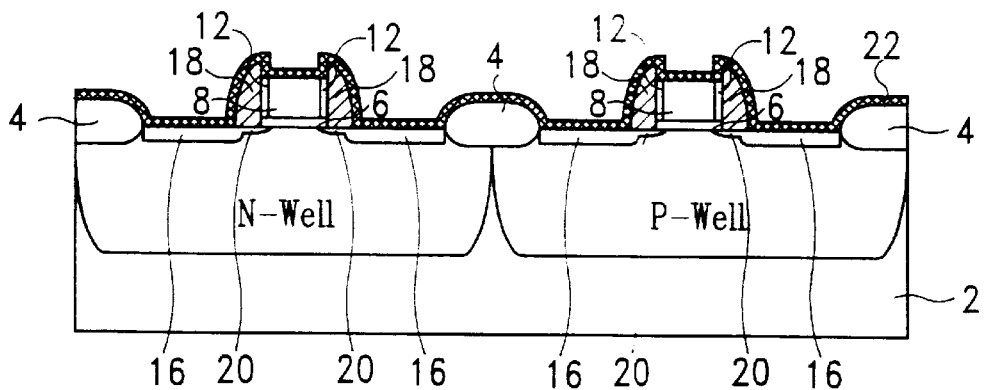
FIG. 8 is a cross sectional view of a semiconductor substrate illustrating the step of forming a metal layer on the semiconductor substrate and the gate according to the present invention.
Figure 9:
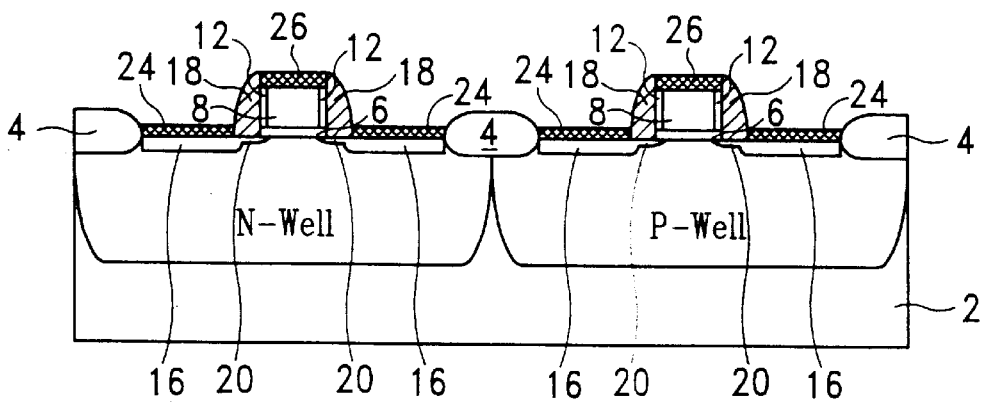
FIG. 9 is a cross sectional view of a semiconductor substrate illustrating the step of forming silicide, polycide on the substrate and gates, respectively according to the present invention.

Turning to FIG. 8, the cap silicon nitride layer 10 are removed to expose the gate 6. This can be completed by means of hot phosphorus acid solution. Then, self-align silicide (SALICIDE) 22 and polycide 24 are respectively formed on the exposed substrate 2 and gate 8. Typically, this can be achieved by using well known processes. For example, a refractory or noble metal layer 22, such as Ti, Pt, Co, W, Ni, Pd, Cr etc, is sputtered on the substrate 2, spacers 18 and gates 8. Then, a rapid thermal anneal (RTA) at 350 to 700 degrees centigrade in $N_2$ ambient is performed to react the sputtering metal with the polysilicon gates 8 and the silicon substrate 2, thereby forming silicide on these portions. Then, a strip step is used to remove non-reactive metal on the side wall spacers 18. Therefore, the SALICIDE 24, polycide 26 are self-aligned formed on these regions.

As can be appreciated from the above disclosure, the present invention provides the following advantages: (1) the device performance can be improved by using the self-aligned silicide and extended source and drain junction technology. (2) extended ultra-shallow junction structures can be obtained using spacers as a diffusion source to suppress the short channel effect or reverse short channel effect, please refer to an article proposed by P. G. Y. Tsui, et al., in IEDM Tech. Dig., p.501, 1994. (3) the sheet resistance of the gate can be sustained by using the cap nitride layer as a barrier for nitrogen implant.

As is understood by a person skilled in the art, the foregoing embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure. Accordingly, while the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for manufacturing a CMOS device on a semiconductor substrate, the method comprising:

forming a first oxide layer on said semiconductor substrate to act as a gate oxide;

forming an undoped polysilicon layer on said first oxide layer to act as gates of said CMOS;

forming a silicon nitride layer on said undoped polysilicon layer to act as an anti-reflective layer;

patterning said silicon nitride layer, said undoped polysilicon layer and said first oxide layer to form gate structures on said semiconductor substrate;

performing a thermal annealing to recover the etching damage of said semiconductor substrate caused by patterning said gate structures, and simultaneously forming a second oxide layer on the surface of said gate structures and on said semiconductor substrate uncovered by said gate structures;

forming a nitrogen doped amorphous silicon layer on said second oxide layer and said gate structures;

performing an ion implantation to dope dopants into said gates and said semiconductor substrate, thereby forming source and drain regions in said semiconductor substrate with a spacer separated from said gate structures;

performing an oxidation to convert said nitrogen doped amorphous silicon layer to a nitrogen doped oxide layer, simultaneously diffusing dopants in said nitrogen doped amorphous silicon layer to said semiconductor substrate, thereby forming extended source and drain junctions adjacent to said gate structures;

etching said nitrogen doped oxide layer to form spacers on the side walls of said gate structures;

removing said silicon nitride layer; and forming a self-aligned silicide (SALICIDE) on said semiconductor substrate and a polycide on said gates.

2. The method of claim 1, wherein said nitrogen doped amorphous silicon layer is formed by using in-situ doped process.

3. The method of claim 2, wherein said in-situ doped process is performed with $Si_2H_6$—$NH_3$ gas.

4. The method of claim 1, further comprising following steps to form said nitrogen doped amorphous silicon layer:

forming a amorphous silicon layer on said second oxide layer and said gate structures; and performing an ion implantation to dope nitrogen ions into said amorphous silicon layer.

5. The method of claim 1, wherein said thermal annealing is performed at a temperature about 750 to 1100 degrees centigrade.

6. The method of claim 1, wherein energy of said ion implantation is about 0.5 to 120 KeV.

7. The method of claim 1, wherein a dosage of said ion implantation is about 5E14 to 5E16 atoms/$cm^2$.

8. The method of claim 1, wherein dopants of said ion implantation is selected from a group consisting of arsenic, phosphorus and the combination thereof for nMOS devices, and is selected from a group consisting of boron, $BF_2$ and the combination thereof for pMOS devices.

9. The method of claim 1, wherein said oxidation is performed at temperature about 800 to 1150 degrees centigrade.

10. The method of claim 1, wherein said oxidation is performed in ambient containing oxygen.

11. The method of claim 1, wherein said silicon nitride layer is removed by using hot phosphorus acid solution.

12. The method of claim 1, wherein said nitrogen doped oxide layer is etched by an anistropical etching.

13. The method of claim 1, wherein a concentration of the nitrogen ions in said nitrogen doped oxide layer is about 1E18–1E21 $cm^3$.

14. The method of claim 1, wherein a thickness of said nitrogen doped amorphous silicon layer is about 400 to 1500 angstroms.

15. The method of claim 1, further comprising the following steps to form said self-aligned silicide (SALICIDE) and said polycide:

forming a metal layer over said on said semiconductor substrate, said spacers and said gates;

performing a thermal process to react said metal layer with said semiconductor substrate and said gates; and removing non-reactive portion of said metal layer.

16. The method of claim 15, wherein said metal layer is selected from a group consisting of Ti, Pt, Co, W, Ni, Pd and Cr.

17. The method of claim 15, wherein said thermal process is performed at temperature about of 350 to 700 degrees centigrade.

18. The method of claim 15, wherein said thermal process is performed in $N_2$ ambient.

* * * * *